United States Patent [19]

Schubert

[11] Patent Number: 4,767,694

[45] Date of Patent: Aug. 30, 1988

[54] METHOD OF PREPARING A BLANKET WITH RESERVED SPACES UTILIZING PHOTOCOPYING PROCEDURE

[75] Inventor: Johannes M. Schubert, Mainhausen, Fed. Rep. of Germany

[73] Assignee: M.A.N.-Roland Druckmaschinen Aktiengesellschaft, Fed. Rep. of Germany

[21] Appl. No.: 948,332

[22] Filed: Dec. 31, 1986

[30] Foreign Application Priority Data

Jan. 15, 1986 [DE] Fed. Rep. of Germany ....... 3600918

[51] Int. Cl.⁴ ........................... G03F 1/00; G03F 7/00

[52] U.S. Cl. ...................................... 430/300; 430/22; 430/157; 430/274; 430/302; 430/306; 430/951; 101/470; 101/471; 101/401.1; 101/401.2

[58] Field of Search ............... 430/300, 302, 306, 175, 430/157, 289, 274, 22, 951; 101/470, 471, 401.1, 401.2

[56] References Cited

U.S. PATENT DOCUMENTS

| | | | |
|---|---|---|---|
| 3,230,088 | 1/1966 | Adams et al. | 430/289 |
| 4,124,389 | 11/1978 | Hoornstra et al. | 430/306 |
| 4,224,399 | 9/1980 | Merrill et al. | 430/302 |
| 4,427,500 | 1/1984 | Platzer | 430/157 |

FOREIGN PATENT DOCUMENTS

DE3516387A1 5/1986 Fed. Rep. of Germany .

OTHER PUBLICATIONS

Publisher: Mohndruck; Editorial direction: Georg Willmann, MOHN Offset-Ratgeber, pp. 466-467 & 502-503.

*Primary Examiner*—Charles L. Bowers, Jr.

*Attorney, Agent, or Firm*—Leydig, Voit & Mayer

[57] ABSTRACT

The invention relates to a method of preparing a varnish blanket. Instead of a proof being used for pre-location of required varnish-free zones on a blanket for blanked-out in-line varnishing in rotary presses, the zones required not to be varnished are transferred by means of a reference copy, and after physico-chemical pretreatment adapted to the surface properties of the blanket, to a blanket stuck to a support plate. In addition to polyvinyl alcohol copying layers or coatings sensitized by bichromate, wipe-on copying layers sensitized by diazo salts are suitable, a positive or negative original being copied by direct contact in known manner onto a blanket thus pretreated. The zones required not to be varnished can therefore be preformed by cutting out the top layer of the blanket.

21 Claims, No Drawings

METHOD OF PREPARING A BLANKET WITH RESERVED SPACES UTILIZING PHOTOCOPYING PROCEDURE

FIELD OF THE INVENTION

The invention relates to a method of preparing a blanket for in-line varnishing with dispersion varnishes on an aqueous base or in association with UV-varnish-resistant blankets for the application of low-viscosity UV-varnish in rotary presses.

BACKGROUND OF THE INVENTION

In in-line varnishing (ink varnish, wet-in-wet) it is often required to keep adhesive strips, boxes for stamping and so on free from an application of varnish. In such cases the top rubber layer of the blanket (varnish blanket) clamped on a forme cylinder is incised in accordance with the position and size of the areas to be blanked out and is then removed. For accurate jobs the position of those parts of the varnish blanket required not to be varnished, i.e., required to be cut out, is so determined that a proof of the ink forme delivering the reference lines transmitted by the material being printed is applied by transfer to the dry varnish blanket. Cutting out the corresponding places in the press is time-consuming and increases set-up time. Removing the blanket after it has received the proof in order to cut it out parallel in time with the complete arrangement of the ink formes of the in-line press is, since the blanket has to be clamped again, also a time-consuming operation and above all cannot be dealt with beforehand.

OBJECTS AND SUMMARY OF THE INVENTION

It is the object of the invention to devise a method for enabling the use of a proof to be omitted and instead for the varnish-free areas on a blanket to be pre-located.

The advantage of the invention is that setting-up times are reduced because the varnish-free areas are pre-locatable rationally in a copiable way on the varnish blanket, something not previously possible. A reference copy method on an offset blanking has therefore been discovered for the first time. Also, printing plates can be clamped on forme cylinders having varnishing facilities in association with a dual-purpose clamping bar for selectively clamping a blanket or a printing plate with one or more self-adhesive blankets, so that blanked-out, in-line varnishing can be carried out.

The invention will be described in greater detail hereinafter with reference to a specific embodiment.

DETAILED DESCRIPTION OF THE PREFERRED EMBODIMENT

In accordance with the invention, a reference copy on offset blankets is prepared as follows. After a physico-chemical pretreatment specially adapted to the surface properties of an offset blanket, a chromation-sensitized polyvinyl alcohol copying layer specially designed for the purpose is applied to the blanket by centrifuging or pouring or wiping. The proportion is approximately 40 $cm^3$ of chromation to approximately 1000 $cm^3$ of layer or coating. The chromated photosensitive copying layer is filtered by a soft paper filter to remove bubbles evolved during mixing (vibration). The surface of a new self-adhesive blanket drawn onto an aluminum offset plate is treated intensively with whiting and a little water by means of a plush pad or very soft brush in small circular movements, whereafter the blanket surface is rinsed with a considerable amount of water.

Blankets previously used for printing and now required to be used for varnishing can be drawn onto aluminum offset plates by means of adhesive or material adhesive on both sides. The adhesive must not be water-soluble. The blanket surface should be degreased with solvent cleaners before connection to the plate and residues of ink and the like should be removed. If the blanket surface of the drawn-on blanket repels water in a pearly fashion, an approximately 10% strength phosphoric acid solution is applied before the cleaning with whiting and the solution left to act for approximately 2 minutes. The blanket surface should then be rinsed clear again with water.

The thoroughly cleaned blanket surfaces with the photosensitive copying layers (copying layers) can be prepared in a variety of ways.

1. Centrifuging the copying layer at from 100 to 150 revolutions per minute onto a wet blanket surface and subsequent drying; the maximum temperature of the copying layer and blanket should be 50° C.;

2. Pouring the copying layer onto an inclined wet blanket surface, the surplus being allowed to drain off, followed by drying with hot air as just described; or 3. Applying a copying layer with a soft sponge to the blanket surface dried after cleaning; this layer must also then be thoroughly dried as in the foregoing approaches.

Only a soft and barely moist viscose sponge should be used to apply the copying layers. Wipe traces are unavoidable when the layers are applied with the sponge, but have no effect so far as a reference copy is concerned.

After exposure, which can be made either with a positive or a negative original, either the blanket is developed with water, then inked, or it is developed directly with a dye concentrate suitable for the copying layer, then rinsed clean and dried. Depending on whether a positive or a negative is used, an adhesive strip to be cut out is formed, for example, as a hardened colored layer or as a fully developed part.

Exposure example: 5000 watt metal halide lamp, distance 1 m, approx. 90 sec., depending upon color of blanket surface.

It can be stated in general that approximately twice the quantity of light needed to expose a precoated positive plate for offset is used.

The polyvinyl alcohol copying layers are colorless layers, and so the color change caused by exposure is not very great. Also, the use of copying layers colored before coating does not produce the clearly visible contrast because of the strong self-color of the background.

There are two methods of inking the hardened copying layer:

1. Development with a water stream (spray) until all of the unhardened layer has been removed. Let the water drain off and then pour on the ink bath concentrate (allow it to act for approximately 1–2 minutes), then rinse clear with water and dry;

2. After exposure pour on generous amounts of ink bath concentrate directly and undiluted and wipe with a cotton plug or soft pad over the whole surface, allow the bath to act for approximately 1–2 minutes, then rinse clear with water and dry.

Only centrifuged or poured copying layers provide a very uniform inking. Wiped-on copying layers still look streaky after inking, but are completely satisfactory for the proposed purpose of a reference copy for cutting out varnish-free adhesive strips or tabs or the like.

For copying, the blanket can either be drawn onto an aluminum printing plate, i.e., a metal support, by means of adhesive or a foil which is adhesive on both sides or a commercially available self-adhesive blanket or a number of pieces can be stuck directly to an appropriate support plate.

Coating and copying onto a blanket tensed at the same force as is required to tense a blanket on a blanket cylinder is also feasible.

Also, for coating on a flat blanket which is neither stretched nor stuck on, positive or negative originals can be used which are reduced in the peripheral direction of printing, i.e., in the direction of movement of the material being printed though the press, by the same percentage in the peripheral direction as corresponds to the stretch of the varnishing blanket when it is clamped on the cylinder, the figure varying between 1 and 3% according to the type of blanket.

The particular method chosen among those described for locating the varnish-free areas to be cut out is governed mainly by the available clamping device of the forme cylinder used for varnishing.

Wipe-on copying layers can also be used. They are merely wiped onto the cleaned dry surface with a sponge and not centrifuged or poured. The photosensitive constituent of wipe-on copying layers is in the form of diazo salts and not bichromate.

The positive or negative originals are governed by the same considerations as hereinbefore set out. A varnish developer is used to develop the exposed layer.

Wipe-on copying layers and varnish developers have become known, for example, under the name of "Neganol processes". This copying process too can be used to provide a reference copy on blanket surfaces.

What is claimed is:

1. A method for preparing a blanket for in-line varnishing with dispersion varnishes on an aqueous base or in association with UV-varnish-resistant blankets for the application of low-viscosity UV-varnish in rotary offset presses, comprising:

(a) pretreating a blanket suitable for offset printing to increase the adherence of a photo-sensitive copying layer to said blanket, (b) applying a photo-sensitive copying layer to the surface of said blanket, (c) forming a reference copy on said blanket by exposing a positive or negative original which is in contact with said photo-sensitive copying layer, (d) removing the top layer of the unexposed portion of said blanket which is not to receive varnish, whereby said method provides for the pre-location of varnish-free areas prior to mounting said blanket on a rotary offset press, and said pre-location allows the simultaneous mounting and alignment of said blanket and a printing plate on said rotary offset press relative to each other and to the varnish recipient.

2. A method according to claim 1 wherein said photo-sensitive copying layer is a polyvinyl alcohol solution sensitized by bichromate.

3. A method according to claim 2 wherein the proportion of bichromate in said polyvinyl alcohol photo-sensitive copying layer is about 4% by volume.

4. A method according to claim 1 wherein the photo-sensitive copying layer is sensitized by diazo salts.

5. A method according to claim 1 wherein said photo-sensitive copying layer is applied to said blanket, said blanket being stretched prior to the application of said photo-sensitive copying layer with the same force as required to stretch a blanket on a formed cylinder and, into the same shape it assumes upon mounting on a varnishing cylinder.

6. A method according to claim 1 wherein the photo-sensitive copying layer is applied to said blanket which is neither stretched nor affixed to any support plate and the positive or negative original used to form a reference copy on said blanket is reduced in the dimension which is parallel to the direction of movement of the material being processed in the press by a percentage equivalent to that experienced by said blanket when stretched and clamped on the cylinder.

7. A method according to claim 4 wherein the photo-sensitive copying layer is a polyvinyl alcohol solution sensitized by bichromate.

8. A method according to claim 7 wherein the proportion of bichromate in said polyvinyl alcohol photo-sensitive copying layer is about 4% by volume.

9. A method according to claim 4 wherein the photo-sensitive copying layer is sensitized by diazo salts.

10. A method according to claim 5 wherein the photo-sensitive copying layer is a polyvinyl alcohol solution sensitized by bichromate.

11. A method according to claim 10 wherein the proportion of bichromate in said polyvinyl alcohol photo-sensitive copying layer is about 4% by volume.

12. A method according to claim 5 wherein the photo-sensitive copying layer is sensitized by diazo salts.

13. A method according to claim 6 wherein prior to pretreating said blanket, the blanket is affixed to a support plate.

14. A method according to claim 13 wherein said photo-sensitive copying layer is applied to said blanket, said blanket being stretched prior to the application of said photo-sensitive copying layer with the same force as required to stretch a blanket on a formed cylinder and, into the same shape it assumes upon mounting on a varnishing cylinder.

15. A method according to claim 14 wherein said photo-sensitive copying layer is a polyvinyl alcohol solution sensitized by bichromate.

16. A method according to claim 15 wherein the proportion of bichromate in said polyvinyl alcohol photo-sensitive copying layer is about 4% by volume.

17. A method according to claim 14 wherein the photo-sensitive copying layer is sensitized by diazo salts.

18. A method according to claim 13 wherein the photo-sensitive copying layer is applied to said blanket which is not stretched and the positive or negative original used to form a reference copy on said blanket is reduced in the dimension which is parallel to the direction of movement of the material being processed in the press by a percentage equivalent to that experienced by said blanket when stretched and clamped on the cylinder.

19. A method according to claim 18 wherein said photo-sensitive copying layer is a polyvinyl alcohol solution sensitized by bichromate.

20. A method according to claim 19 wherein the proportion of bichromate in said polyvinyl alcohol photo-sensitive copying layer is about 4% by volume.

21. A method according to claim 18 wherein the photo-sensitive copying layer is sensitized by diazo salts.

* * * * *